(12) United States Patent
Onishi

(10) Patent No.: US 8,389,308 B2
(45) Date of Patent: Mar. 5, 2013

(54) METHOD FOR PRODUCING SURFACE EMITTING SEMICONDUCTOR DEVICE

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/267,104

(22) Filed: Oct. 6, 2011

(65) Prior Publication Data
US 2012/0094408 A1 Apr. 19, 2012

(30) Foreign Application Priority Data
Oct. 18, 2010 (JP) .................. 2010-233690

(51) Int. Cl.
*H01L 21/00* (2006.01)
(52) U.S. Cl. ..................... 438/29; 257/E33.06
(58) Field of Classification Search .................. 438/29; 257/E33.06
See application file for complete search history.

(56) References Cited

U.S. PATENT DOCUMENTS

| | | | |
|---|---|---|---|
| 6,570,905 B1 | 5/2003 | Ebeling | |
| 6,696,308 B1 * | 2/2004 | Shieh et al. | 438/24 |
| 7,075,961 B2 * | 7/2006 | Steinle et al. | 372/43.01 |
| 7,098,059 B2 * | 8/2006 | Otoma et al. | 438/28 |
| 7,157,298 B2 * | 1/2007 | Nakayama et al. | 438/46 |
| 7,515,623 B2 * | 4/2009 | Watanabe et al. | 372/46.013 |

* cited by examiner

*Primary Examiner* — Trung Q Dang
(74) *Attorney, Agent, or Firm* — Smith, Gambrell & Russell, LLP

(57) ABSTRACT

A method for producing a surface emitting semiconductor device includes a step of forming a semiconductor stacked structure including an active layer, a first semiconductor layer containing aluminum on the active layer, and a DBR portion, on the first semiconductor layer, to include alternating stacked second semiconductor layers and third semiconductor layers having different aluminum contents; a step of forming a mesa portion by etching the DBR portion and the first semiconductor layer; an oxidation step of oxidizing the first semiconductor layer from a side face of the mesa portion toward the inside of the mesa portion to form an annular oxidized region inside the first semiconductor layer; a first etching step of selectively etching an oxidized region formed in the DBR portion; and a second etching step of removing a peripheral portion of the DBR portion.

9 Claims, 17 Drawing Sheets

US 8,389,308 B2

METHOD FOR PRODUCING SURFACE EMITTING SEMICONDUCTOR DEVICE

BACKGROUND OF THE INVENTION

1. Field of the Invention

The present invention relates to a method for producing a surface emitting semiconductor device.

2. Description of the Related Art

A vertical cavity surface emitting laser (VCSEL), for example, includes an active layer, a distributed Bragg reflector (DBR), and a current-confinement layer disposed between the active layer and the DBR. The current-confinement layer has a high-resistance region so as to confine a current in a center region surrounding the high-resistance region. For example, U.S. Pat. No. 6,570,905 describes a VCSEL formed on a GaAs substrate. In the VCSEL, an AlGaAs layer having a high aluminum content of 90% or more is used as a current-confinement layer.

FIGS. 12 to 15 are cross-sectional views showing steps of producing such a VCSEL. First, as shown in FIG. 12, an n-type DBR 102, an active layer (multi quantum well (MQW) structure) 103, a spacer layer 110, a current-confinement layer 104, and a p-type DBR 105 are sequentially grown on an n-type GaAs substrate 101. The n-type DBR 102 includes low-refractive-index layers 102a composed of $Al_{0.9}Ga_{0.1}As$ and high-refractive-index layers 102b composed of $Al_{0.1}Ga_{0.9}As$, the low-refractive-index layers 102a and the high-refractive-index layers 102b being alternately stacked. Similarly, the p-type DBR 105 includes low-refractive-index layers 105a composed of $Al_{0.9}Ga_{0.1}As$ and high-refractive-index layers 105b composed of $Al_{0.1}Ga_{0.9}As$, the low-refractive-index layers 105a and the high-refractive-index layers 105b being alternately stacked. The current-confinement layer 104 is composed of, for example, $Al_{0.96}Ga_{0.04}As$.

Next, a dry etching process is performed on the p-type DBR 105 and the current-confinement layer 104 to form a mesa portion 106 shown in FIG. 13. Subsequently, as shown in FIG. 14, the current-confinement layer 104 of the mesa portion 106 is oxidized from the side face of the mesa portion 106 toward the inside thereof. Thus, an annular oxidized region (high-resistance region) 104a containing aluminum oxide is formed in the current-confinement layer 104. In this step, in the p-type DBR 105, the low-refractive-index layers 105a composed of $Al_{0.9}Ga_{0.1}As$ having a relatively high aluminum content are also oxidized from the side face of the mesa portion 106 toward the inside thereof, simultaneously. As a result, oxidized regions 105c containing aluminum oxide are formed. Subsequently, as shown in FIG. 15, an insulating film 107 and electrodes 108 and 109 are formed, thus producing a VCSEL 100. The VCSEL 100 has the annular oxidized region (high-resistance region) 104a containing aluminum oxide in the current-confinement layer 104. A current is confined in the center region surrounding the high-resistance oxidized region 104a.

SUMMARY OF THE INVENTION

In the method described above, as shown in FIG. 14, the annular oxidized region (high-resistance region) 104a containing aluminum oxide is formed in the current-confinement layer 104 by selectively oxidizing the AlGaAs layer having a high aluminum content of the mesa portion 106 from the side face of the mesa portion 106 toward the inside thereof. However, as shown in FIG. 14, the oxidized regions 105c containing aluminum oxide are also formed in the p-type DBR 105, simultaneously. Since a lattice constant of aluminum oxide is significantly different from lattice constants of other semiconductors (such as GaAs and AlGaAs), a large strain is generated at interfaces between each of the oxidized regions 105c and each of the other semiconductor layers. In addition, in order to form the p-type DBR 105 having a high reflectivity, the p-type DBR 105 preferably has 20 or more low-refractive-index layers 105a and 20 or more high-refractive-index layers 105b. Therefore, the above-mentioned strain due to the lattice-mismatch between the oxidized regions 105c and the other semiconductor layers further increases. As a result, a large stress is applied to the whole mesa portion 106. Cracks or dislocations may be formed in the mesa portion 106, resulting in a decrease in reliability of the device.

In order to reduce the influence of a stress caused by the lattice-mismatch in the oxidized regions 105c, the following method can be employed. Specifically, after the steps shown in FIGS. 12 to 14, an etching mask having a diameter slightly smaller than the diameter of the mesa portion 106 is formed on the mesa portion 106. A peripheral portion of the mesa portion 106 including the oxidized regions 105c is removed by a dry etching process using the etching mask. By employing this method, the oxidized regions 105c of the p-type DBR 105 are removed as shown in FIG. 16. Next, as shown in FIG. 17, an insulating film 107 and electrodes 108 and 109 are formed. According to this method, the oxidized regions 105c of the p-type DBR 105 can be removed, and the stress in the mesa portion 106 can be suppressed.

However, it was found that the following problem occurs, when this method is employed. The etching rate of the oxidized regions 105c containing aluminum oxide in the dry etching process is lower than the etching rate of a semiconductor such as AlGaAs. Accordingly, when the dry etching process is performed so as to sufficiently remove the oxidized regions 105c, other semiconductor regions located around the mesa portion 106 are excessively etched. As a result, as shown in FIG. 16 for example, the active layer 103, the n-type DBR 102, and the n-type GaAs substrate 101 are also etched. In the VCSEL having this structure, heat generated in the active layer 103 is not easily dissipated through the substrate, thereby degrading heat dissipation characteristics. As a result, the device characteristics are also degraded.

A method for producing a surface emitting semiconductor device according to the present invention includes a step of forming a semiconductor stacked structure including an active layer, a first semiconductor layer containing aluminum and provided on the active layer, and a distributed Bragg reflector (DBR) portion provided on the first semiconductor layer, the DBR portion including second semiconductor layers and third semiconductor layers alternately stacked to each other, the second semiconductor layers and the third semiconductor layers having different aluminum contents; a step of forming a mesa portion by etching the DBR portion and the first semiconductor layer; an oxidation step of oxidizing the first semiconductor layer from a side face of the mesa portion toward the inside of the mesa portion, and forming an annular oxidized region inside the first semiconductor layer; a first etching step of selectively etching an oxidized region formed in the DBR portion in the oxidation step by a wet etching; and a second etching step of removing a peripheral portion of the DBR portion by etching.

In this method, first, a semiconductor stacked structure including an active layer, a first semiconductor layer containing aluminum and provided on the active layer and, and a DBR portion provided on the first semiconductor layer is formed. The DBR portion includes second semiconductor layers and third semiconductor layers alternately stacked to each other. The second semiconductor layers and the third semiconductor layers of the DBR portion have different aluminum contents. A mesa portion is then formed by etching the DBR portion and the first semiconductor layer. Subsequently, the first semiconductor layer containing aluminum is oxidized from a side face of the mesa portion toward the inside of the mesa portion (oxidation step). In this oxidation step, an annular oxidized region for current confinement is formed inside the first semiconductor layer. In addition, the second semiconductor layers and the third semiconductor layers of the DBR portion are oxidized, and then an oxidized region is formed in the DBR portion. Subsequently, the oxidized region formed in the DBR portion is selectively etched by a wet etching (first etching step). In this first etching step, the oxidized region can be selectively etched and removed while suppressing etching of non-oxidized semiconductors. Subsequently, in a second etching step, a peripheral portion of the DBR portion is removed by etching, thereby adjusting the shape of the mesa portion without excessively etching the non-oxidized semiconductors of the mesa portion. According to the above method, since the oxidized region and the non-oxidized semiconductors can be separately etched by the most suitable methods, it is possible to prevent etching from reaching the substrate in the first etching step and the second etching step. As a result, a degradation of heat dissipation characteristics can be suppressed. In addition, since the oxidized region can be effectively removed, a decrease in reliability due to an internal stress can be suppressed. Furthermore, the DBR portion is configured by alternately stacking second semiconductor layers and third semiconductor layers having different aluminum contents. In the oxidation step, an oxidized region of each of the semiconductor layers having a high aluminum content, extends to the inner side of the DBR portion, as compared with an oxidized region of each of the semiconductor layers having a low aluminum content. Accordingly, in the first etching step, both the oxidized regions of the second semiconductor layers and the oxidized regions of the third semiconductor layers in the DBR portion can be effectively removed. After the first etching step, projections and recesses are formed on the side face of the DBR portion. These projections and recesses can be effectively eliminated in the second etching step.

In the method, the aluminum content of the first semiconductor layer is preferably higher than the aluminum contents of the second semiconductor layers and the third semiconductor layers of the DBR portion. In this case, the first semiconductor layer has the highest aluminum content. In the oxidation step, the first semiconductor layer is oxidized from a side face of the mesa portion toward the inside of the mesa portion with the highest oxidation rate. Therefore, a width of an oxidized region formed in the first semiconductor layer is the largest. Thus, the oxidized region can be formed so as to extend to a position closer to the center of the mesa portion. A current is injected into the active layer through the non-oxidized region surrounded by the oxidized region in the first semiconductor layer. Therefore, the injected current is effectively confined in the center of the mesa portion.

In the method, the first semiconductor layer is preferably composed of an AlGaAs semiconductor or an AlAs semiconductor. The first semiconductor layer may be composed of an AlGaAs semiconductor and the aluminum content of the AlGaAs semiconductor may be 90% or more.

In the oxidation step of the method, the first semiconductor layer may be selectively oxidized in a water vapor atmosphere after the step of forming the mesa portion.

In the first etching step of the method, buffered hydrofluoric (BHF) acid may be used as an etchant for selectively etching the oxidized region formed in the DBR portion.

In the second etching step of the method, the peripheral portion of the DBR portion may be removed by dry etching. Alternatively, in the second etching step, the peripheral portion of the DBR portion may be removed by wet etching, and semiconductor layers having a low aluminum content among the second semiconductor layers and the third semiconductor layers of the DBR portion may be selectively etched. In the second etching step, an etchant containing citric acid may be used as the etchant for the wet etching.

DESCRIPTION OF THE PREFERRED EMBODIMENTS

Figure 1:
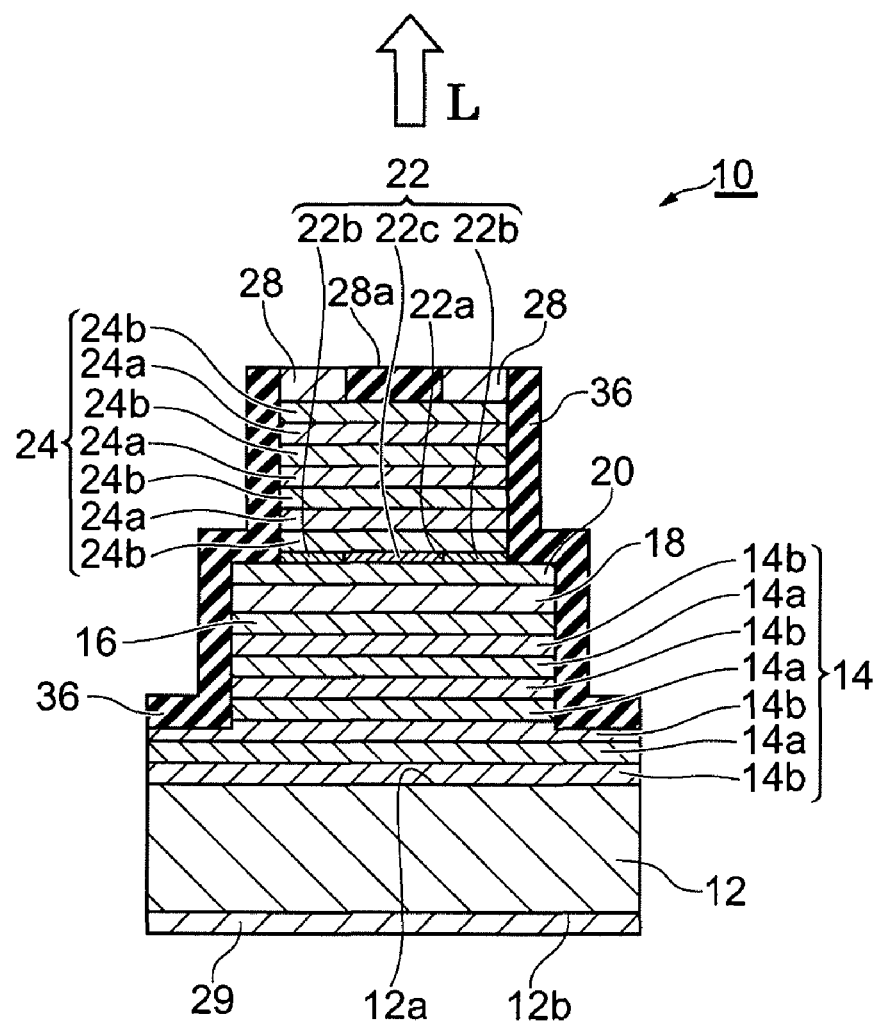
FIG. 1 is a cross-sectional side view of a surface emitting semiconductor device produced by a production method according to the present invention.

Embodiments of a method for producing a surface emitting semiconductor device according to the present invention will now be described in detail with reference to the accompanying drawings. In a description of the drawings, the same elements are assigned the same reference numerals and an overlapping description is omitted.

FIG. 1 is a cross-sectional side view of a surface emitting laser 10 which is an embodiment of a surface emitting semiconductor device produced by a method according to the present invention. The surface emitting laser 10 shown in FIG. 1 is a vertical cavity surface emitting laser (VCSEL), for example. In this embodiment, an emission direction of light L emitted from the surface emitting laser 10 is a direction perpendicular to a main surface 12a of a semiconductor substrate 12.

The surface emitting laser 10 includes a semiconductor substrate 12 of a first conductivity type, a first DBR portion 14 of the first conductivity type provided on the main surface 12a of the semiconductor substrate 12, an active layer 18 provided on the first DBR portion 14, a current-confinement layer 22 of a second conductivity type provided on the active layer 18, and a second DBR portion 24 of the second conductivity type provided on the current-confinement layer 22. The semiconductor substrate 12 is composed of a semiconductor of the first conductivity type, for example, n-type GaAs. The first and second DBR portions 14 and 24 constitute a laser cavity in a direction perpendicular to the main surface 12a. The first DBR portion 14, the active layer 18, the current-confinement layer 22, and the second DBR portion 24 are arranged in a direction perpendicular to the main surface 12a.

The first and second DBR portions 14 and 24 each include a distributed Bragg reflector mirror having high reflectivity of 95% or more. Specifically, the first DBR portion 14 includes a plurality of semiconductor layers 14a and 14b that are alternately arranged in a direction perpendicular to the main surface 12a. Similarly, the second DBR portion 24 includes a plurality of semiconductor layers 24a and 24b that are alternately arranged in a direction perpendicular to the main surface 12a.

The semiconductor layers 14a and 14b are composed of, for example, n-type AlGaAs semiconductors having different aluminum contents. The refractive index of the semiconductor layers 14a is different from the refractive index of the semiconductor layers 14b. For example, the semiconductor layers 14a are composed of n-type $Al_{0.9}Ga_{0.1}As$, and the semiconductor layers 14b are composed of n-type $Al_{0.1}Ga_{0.9}As$. In this case, since the aluminum content of the semiconductor layers 14a is higher than the aluminum content of the semiconductor layers 14b, the refractive index of the semiconductor layers 14a is lower than the refractive index of the semiconductor layers 14b.

The semiconductor layers 24a and 24b are composed of, for example, p-type AlGaAs semiconductors having different aluminum contents. The refractive index of the semiconductor layers 24a is different from the refractive index of the semiconductor layers 24b. For example, the semiconductor layers 24a are composed of p-type $Al_{0.9}Ga_{0.1}As$, and the semiconductor layers 24b are composed of p-type $Al_{0.1}Ga_{0.9}As$. In this case, since the aluminum content of the semiconductor layers 24a is higher than the aluminum content of the semiconductor layers 24b, the refractive index of the semiconductor layers 24a is lower than the refractive index of the semiconductor layers 24b.

The active layer 18 is composed of a semiconductor material such as InGaAs, GaInNAs, GaInNAsSb, AlGaInAs, or GaInAsP. The active layer 18 may be composed of a bulk crystal or may have a quantum well (QW) structure. Alternatively, the active layer 18 may have a multi quantum well (MQW) structure including a plurality of well layers and a plurality of barrier layers that are alternately arranged in a direction perpendicular to the main surface 12a. The well layers are composed of, for example, InGaAs or the like. The barrier layers are composed of, for example, GaAs.

The current-confinement layer 22 is provided between the active layer 18 and the second DBR portion 24 and confines a current injected into the active layer 18. The current-confinement layer 22 includes an oxidized region (high-resistance region) 22b in which an opening 22a is formed, and a semiconductor region 22c embedding the opening 22a. Light generated in the active layer 18 propagates in the direction perpendicular to the main surface 12a through the opening 22a, and light is reflected by the first and second DBR portions 14 and 24. In this configuration, the first and second DBR portions 14 and 24 constitute a laser cavity. Therefore, an optical axis of the light L expands in the direction perpendicular to the main surface 12a. The shape of the opening 22a is preferably symmetrical with respect to the optical axis of the light L. More preferably, the shape of the opening 22a on a surface orthogonal to the optical axis of the light L is a circle or a square. The oxidized region 22b is formed by oxidizing a semiconductor layer containing aluminum. The oxidized region 22b contains aluminum oxide ($Al_xO_y$). The current-confinement layer 22 is composed of, for example, p-type AlGaAs or p-type AlAs. When the current-confinement layer 22 is composed of p-type AlGaAs, the aluminum content is preferably 90% or more, and is typically 96%.

A spacer layer 16 is provided between the first DBR portion 14 and the active layer 18. The spacer layer 16 is composed of, for example, n-type $Al_{0.2}Ga_{0.8}As$. A spacer layer 20 is provided between the active layer 18 and the current-confinement layer 22. The spacer layer 20 is composed of, for example, p-type $Al_{0.2}Ga_{0.8}As$.

An anode electrode 28 is provided on the second DBR portion 24. An opening 28a for passing through the light L is formed in the anode electrode 28. The light L is emitted through the opening 28a in the direction perpendicular to the main surface 12a, that is the optical axis of the light L. A cathode electrode 29 is provided on a surface opposite to the main surface 12a of the semiconductor substrate 12, i.e., on a back surface 12b of the semiconductor substrate 12.

In the surface emitting laser 10 having the above configuration, when a drive voltage is applied between the anode electrode 28 and the cathode electrode 29, a current is injected into the active layer 18 through the opening 22a of the current-confinement layer 22. Light generated in the active layer 18 propagates between the first DBR portion 14 and the second DBR portion 24 that constitute the laser cavity, and then laser oscillation occurs in the laser cavity. A laser beam (light) L is emitted outside the surface emitting laser 10.

Next, a method for producing the surface emitting laser 10 of this embodiment will be described. In the description below, silicon (Si) is preferably used as an n-type dopant, and carbon (C) is preferably used as a p-type dopant.

Figure 2:
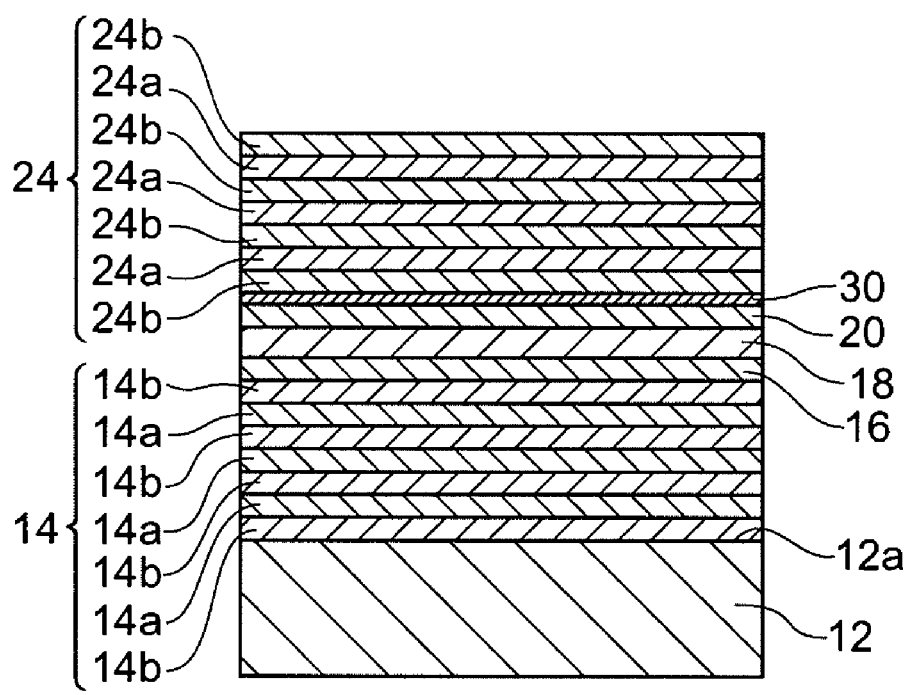
FIG. 2 is a cross-sectional side view showing a step of growing semiconductor layers on a semiconductor substrate.

First, as shown in FIG. 2, a plurality of semiconductor layers 14a (e.g., n-type $Al_{0.9}Ga_{0.1}As$) and a plurality of semiconductor layers 14b (e.g., n-type $Al_{0.1}Ga_{0.9}As$) are alternately grown on a main surface 12a of a semiconductor substrate 12 of a first conductivity type (e.g., n-type GaAs substrate) so as to form a first DBR portion 14. Furthermore, a spacer layer 16 (e.g., n-type $Al_{0.2}Ga_{0.8}As$), an active layer 18, and a spacer layer 20 (e.g., p-type $Al_{0.2}Ga_{0.8}As$) are sequentially grown on the first DBR portion 14. To obtain the high reflectivity of more than 95%, the number of semiconductor layers 14a and the number of semiconductor layers 14b are each 30, for example.

Subsequently, a semiconductor layer 30 to be formed into a current-confinement layer 22 is grown on the spacer layer 20. This semiconductor layer 30 is a first semiconductor layer of this embodiment and is composed of a semiconductor containing aluminum, such as p-type AlGaAs or p-type AlAs. When the semiconductor layer 30 is composed of an AlGaAs semiconductor, the aluminum content is preferably 90% or more. For example, the aluminum content of the AlGaAs semiconductor is 96% for the semiconductor layer 30.

Subsequently, a plurality of semiconductor layers 24a and a plurality of semiconductor layers 24b are alternately grown on the semiconductor layer 30 so as to form a second DBR portion 24. As described above, the semiconductor layers 24a and the semiconductor layers 24b are composed of AlGaAs semiconductors having different aluminum contents. Therefore, the refractive index of the semiconductor layers 24a is different from the refractive index of the semiconductor layers 24b. For example, the aluminum content of the semiconductor layers 24a is 90%, and the aluminum content of the semiconductor layers 24b is 10%. To obtain the high reflectivity of more than 95%, the number of semiconductor layers 24a and the number of semiconductor layers 24b are each 23, for example. The semiconductor layers 24a are each a second semiconductor layer of this embodiment, and the semiconductor layers 24b are each a third semiconductor layer of this embodiment. Through the above steps, a semiconductor stacked structure 32 including the active layer 18, the semiconductor layer 30, and the second DBR portion 24 is formed, as shown in FIG. 2.

Figure 3:
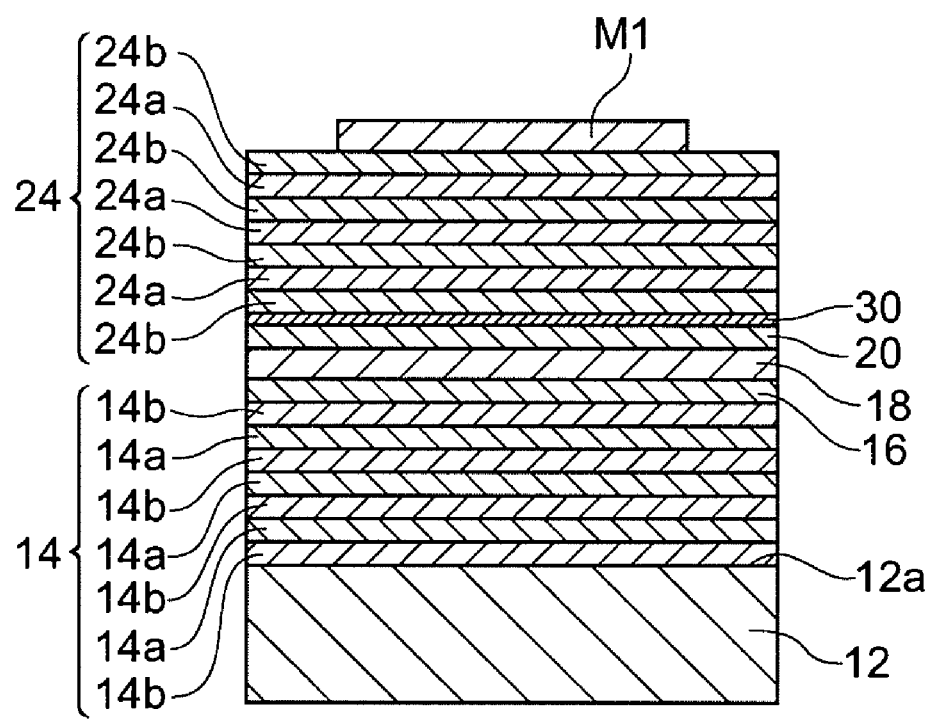
FIG. 3 is a cross-sectional side view showing a step of forming an etching mask.
Figure 4:
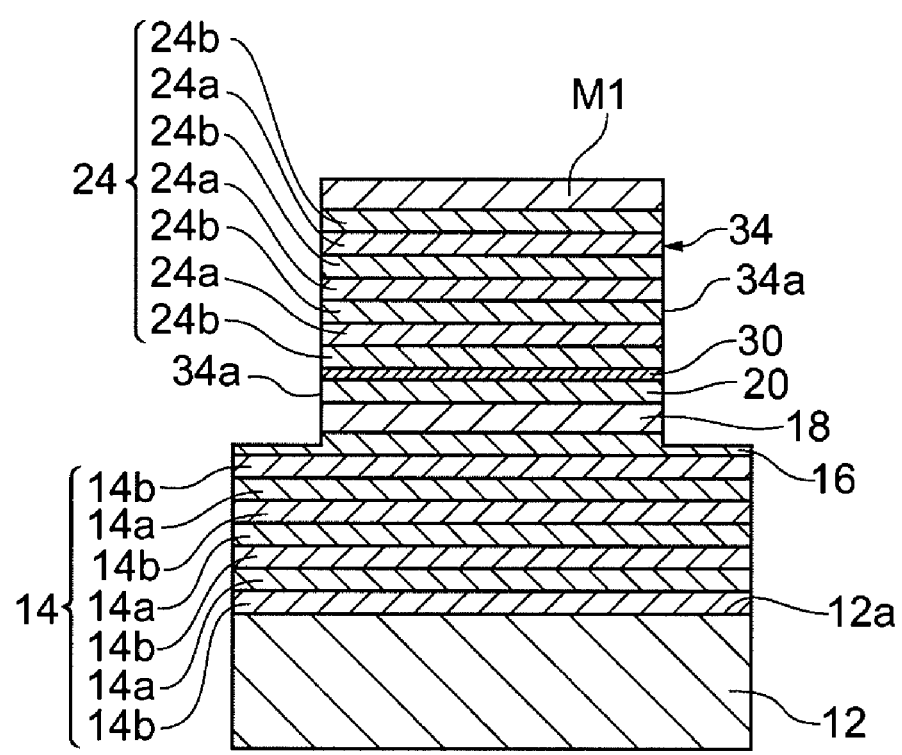
FIG. 4 is a cross-sectional side view showing a mesa formation step.

Subsequently, an etching mask M1 shown in FIG. 3 is formed. This etching mask M1 having a predetermined pattern is formed by, for example, depositing an insulating film composed of SiN, $SiO_2$, or the like on the wafer, and then etching the insulating film using a photolithography technique. The etching mask M1 has, for example, a circular shape having a diameter of 50 μm. Subsequently, as shown in FIG. 4, the second DBR portion 24 and the semiconductor layer 30 of the semiconductor stacked structure 32 are etched using the etching mask M1 to form a mesa portion 34 having a side face 34a (mesa formation step). When this mesa portion 34 is formed, the semiconductor layer 30 is exposed on the side face 34a. In this embodiment, an etching depth of the above etching reaches the spacer layer 16, whereby the mesa portion 34 includes the active layer 18, the semiconductor layer 30, and the second DBR portion 24. In the etching process, a dry etching process using a chlorine-containing gas as an etchant is preferably performed. Alternatively, a wet etching process using a bromine-containing etchant may be performed. The height of the mesa portion 34 (i.e., the etching depth) is, for example, 4 μm.

Figure 5:
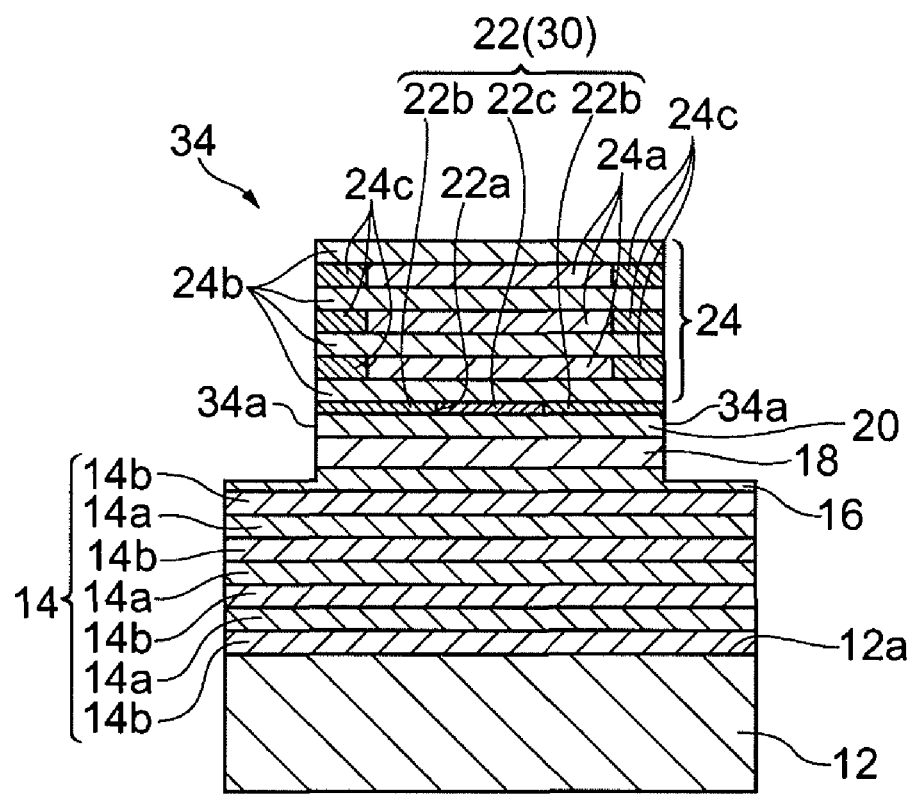
FIG. 5 is a cross-sectional side view showing an oxidation step.

Subsequently, the semiconductor layer 30 included in the mesa portion 34 is selectively oxidized from the side face 34a of the mesa portion 34 toward the inside thereof (oxidation step). In this step, as shown in FIG. 5, an annular oxidized region 22b having an opening 22a is formed in the semiconductor layer 30. A portion near the center of the semiconductor layer 30 is not oxidized and remains as a semiconductor region 22c. Thus, a current-confinement layer 22 including the semiconductor region 22c and the oxidized region 22b is formed. In this step, oxidized regions 24c are also formed in the second DBR portion 24, simultaneously. These oxidized regions 24c are mainly formed in the vicinity of the side face 34a of the plurality of semiconductor layers 24a, which have a relatively high aluminum content.

Figure 14:
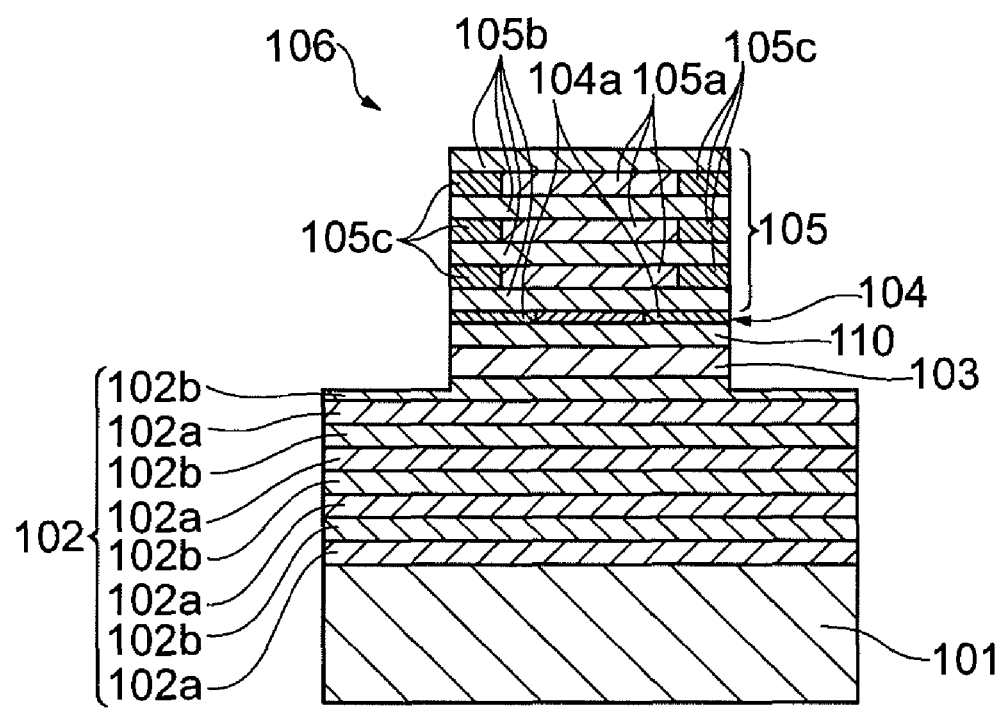
FIG. 14 is a cross-sectional side view showing a step (oxidation step) in the method for producing a conventional VCSEL.
Figure 15:
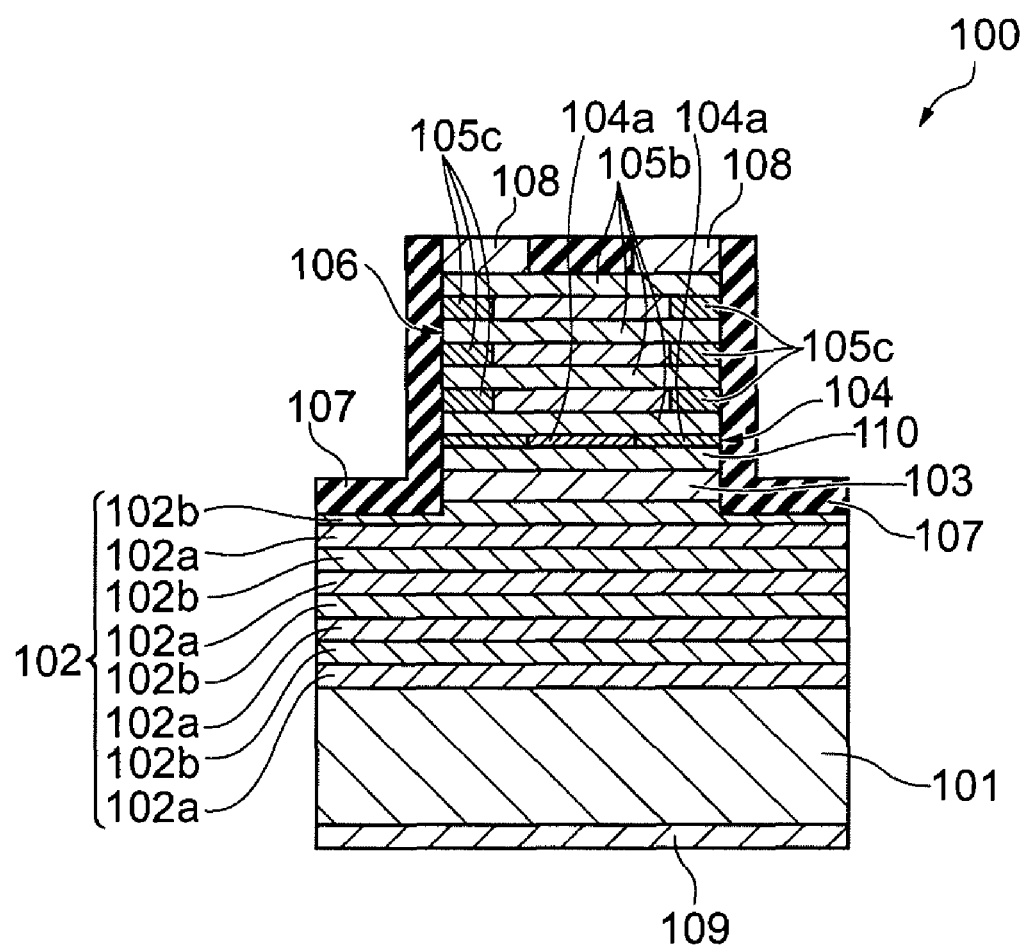
FIG. 15 is a cross-sectional side view showing a step (step of forming an insulating film and electrodes) in the method for producing a conventional VCSEL.

In the oxidation step, a wafer having a mesa portion 34 is loaded in an oxidation apparatus and oxidized in a water vapor atmosphere, thus forming the oxidized region 22b. The water vapor can be supplied to the oxidation apparatus by bubbling pure water heated at 80° C. to 100° C. using nitrogen gas as a carrier gas. In this step, the ambient temperature of the wafer is controlled to be, for example, 350° C., and the oxidation time is, for example, 40 minutes. According to this condition, a width from the side face 34a of the mesa portion 34 to the inner end of the oxidized region 22b, that is, an oxidation depth of the oxidized region 22b from the side face 34a is 19 μm. A width from the side face 34a of the mesa portion 34 to the inner end of each of the oxidized regions 24c, that is, an oxidation depth of each of the oxidized regions 24c from the side face 34a is 5 μm. By the way, for a conventional VCSEL shown in FIG. 14, the oxidation depth from the side face to the inner end of the oxidized region 104a is 9 μm, and the oxidation depth from the side face to the inner end of each of the oxidized regions 105c is 2 μm. The oxidation rate increases with an increase in the aluminum content, and thus a larger width of the oxidized region is obtained in a semiconductor layer having a higher aluminum content. In this embodiment, the current-confinement layer 22 (semiconductor layer 30) has the highest aluminum content. Accordingly, the width of the oxidized region 22b of the current-confinement layer 22 is the largest, and the oxidized region 22b is formed so as to extend to a position close to the center of the mesa portion 34.

Figure 6:
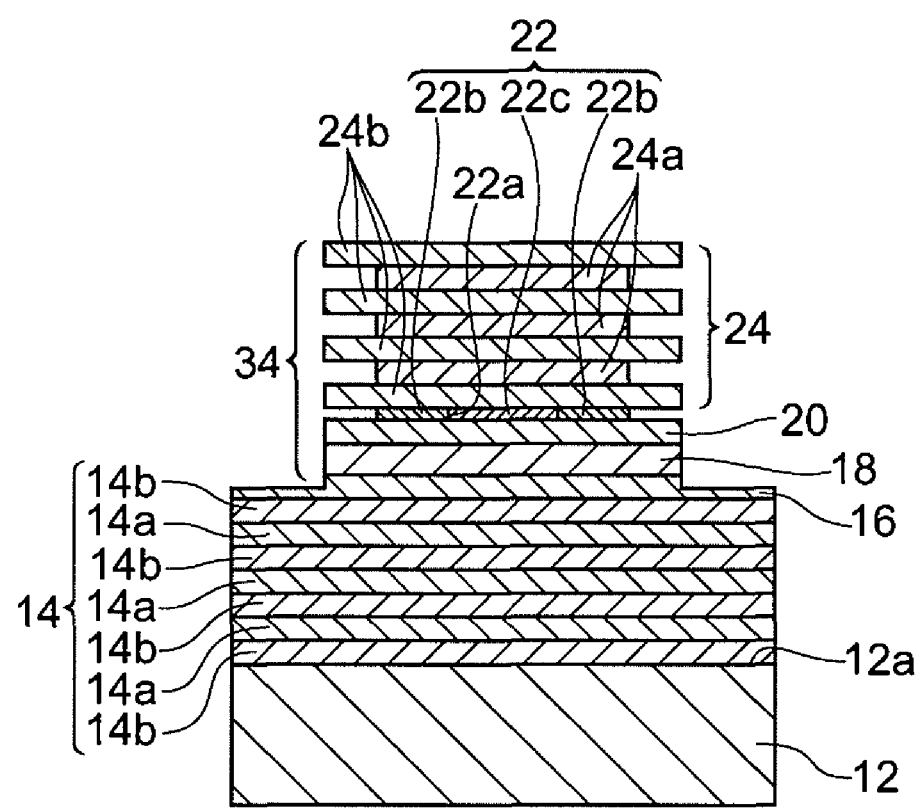
FIG. 6 is a cross-sectional side view showing a first etching step.

Subsequently, a selective wet etching is performed on the oxidized region 22b and the oxidized regions 24c (first etching step). This step is performed in order to remove the oxidized regions 24c formed in the second DBR portion 24. Specifically, a wet etching process is performed on the mesa portion 34. In this step, buffered hydrofluoric (BHF) acid is preferably used as an etchant. As a result, as shown in FIG. 6, the oxidized regions 24c of the second DBR portion 24 are removed. Note that a portion of the oxidized region 22b is left by adjusting the etching time.

In this step, non-oxidized regions (for example, AlGaAs) are hardly etched, and regions containing $Al_xO_y$ are selectively etched. Accordingly, the semiconductor layers 24b, each of which includes a small oxidized region because of a low aluminum content thereof, are hardly etched and remain. Therefore, as shown in FIG. 6, the semiconductor layers 24a and 24b form projections and recesses on the side face of the second DBR portion 24.

Figure 7:
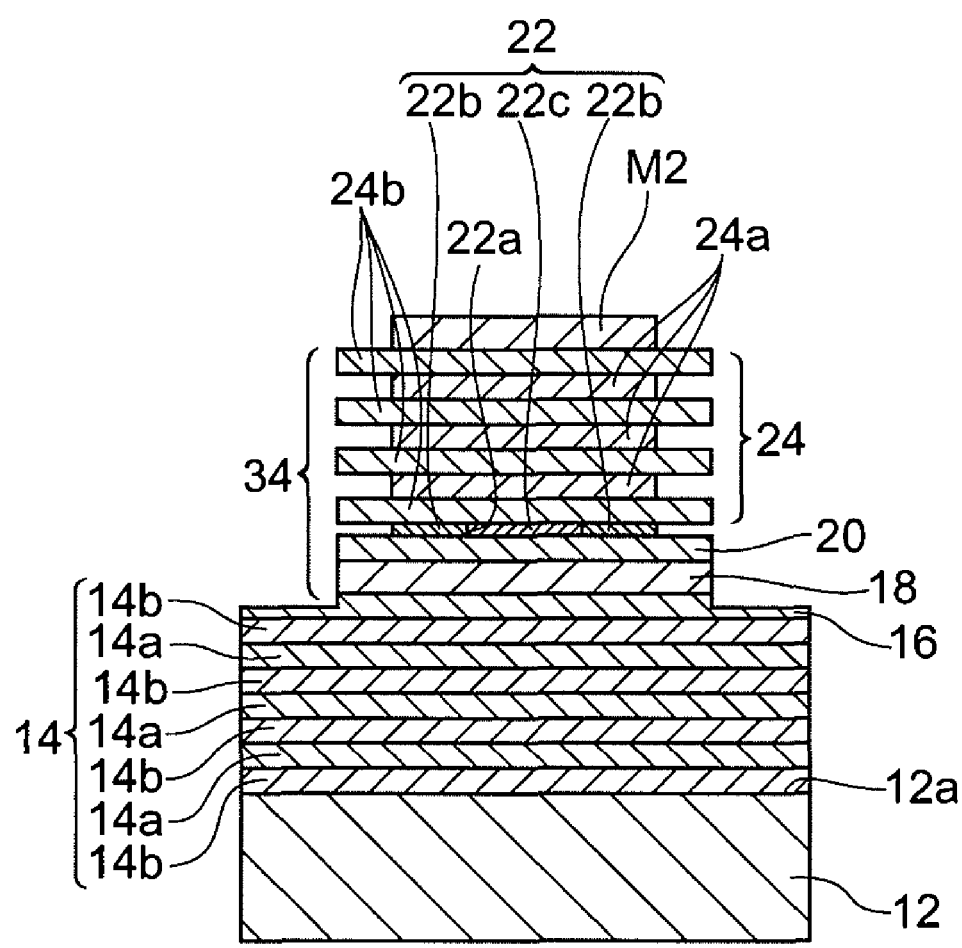
FIG. 7 is a cross-sectional side view showing a step of forming an etching mask.
Figure 8:
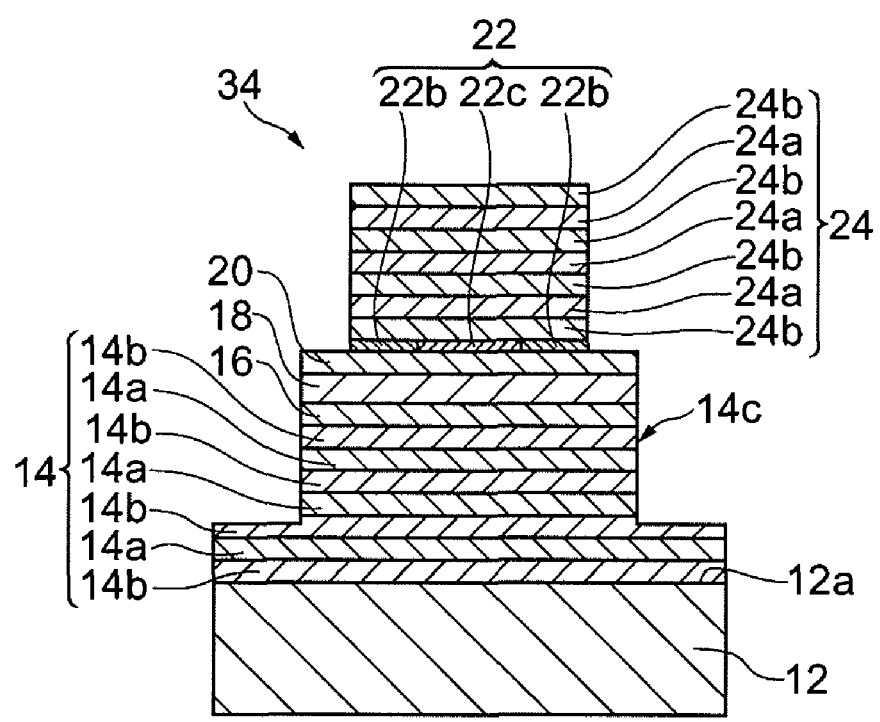
FIG. 8 is a cross-sectional side view showing a second etching step.

Subsequently, the mesa portion 34 is again etched, thereby removing a peripheral portion of the second DBR portion 24 (second etching step). First, as shown in FIG. 7, an etching mask M2 is formed on the mesa portion 34. The etching mask M2 has, for example, a circular shape with a diameter of 30 μm, and the etching mask M2 is smaller than the etching mask M1 (refer to FIG. 3). This etching mask M2 can be formed by using the same method and the same material as those of the etching mask M1 described above. In the second etching step, the mesa portion 34 is etched by a dry etching process using this etching mask M2 to remove the peripheral portion of the mesa portion 34. Thus, the diameter of the mesa portion 34 is reduced, for example, from 50 μm to 30 μm. As shown in FIG. 8, in this step, the side face of the mesa portion 34 is planarized, and all the oxidized regions 24c (refer to FIG. 5) are completely removed. In this step, the first DBR portion 14 is also etched, and a side face 14c is formed.

Figure 9:
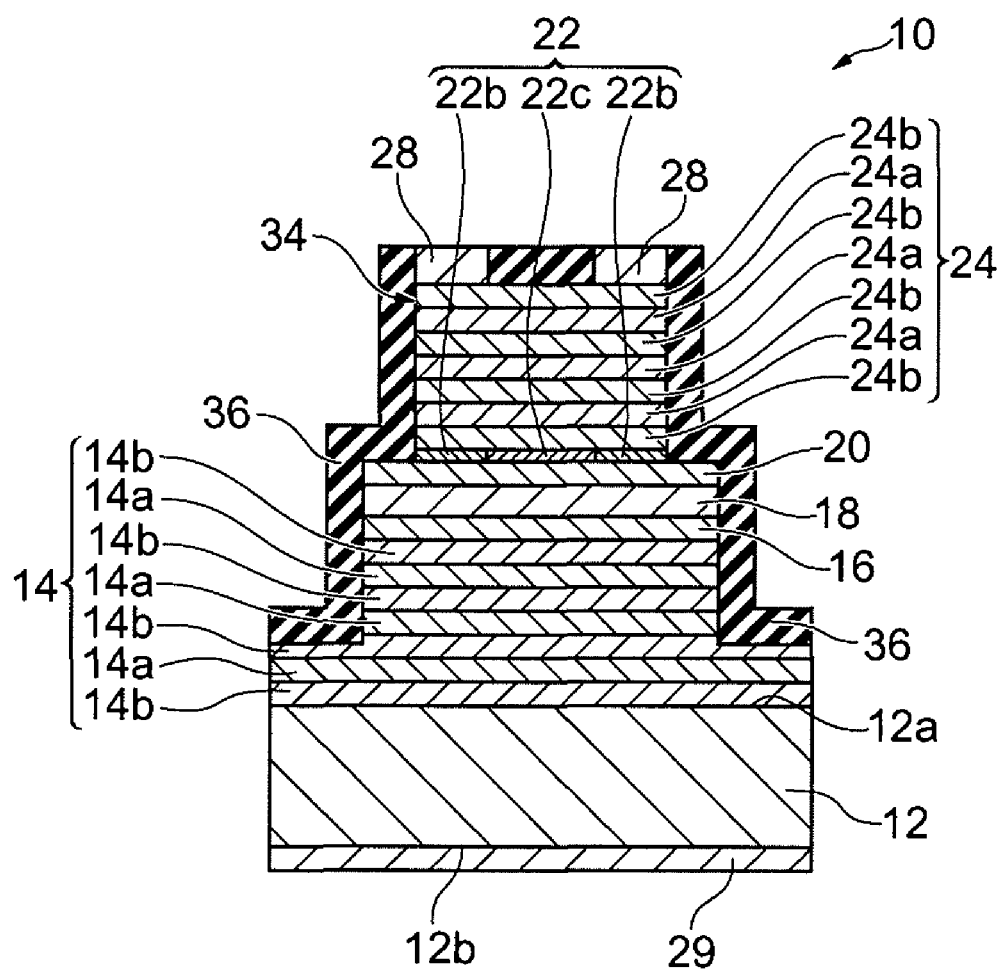
FIG. 9 is a cross-sectional side view showing a step of forming an insulating film and electrodes.

Lastly, as shown in FIG. 9, an insulating film 36 is formed on the top surface and the side face of the mesa portion 34, and the side face 14c of the first DBR portion 14. The insulating film 36 is composed of, for example, SiN, $SiO_2$, or the like. Next, an opening of the insulating film 36 is formed on the top surface of the mesa portion 34, and an anode electrode 28 is formed in the opening. The anode electrode 28 is directly contact with the second DBR portion 24 of the mesa portion 34 through the opening of the insulating film 36. A cathode electrode 29 is formed on a back surface 12b of the semiconductor substrate 12. Through the above steps, the surface emitting laser 10 of this embodiment is produced.

Figure 16:
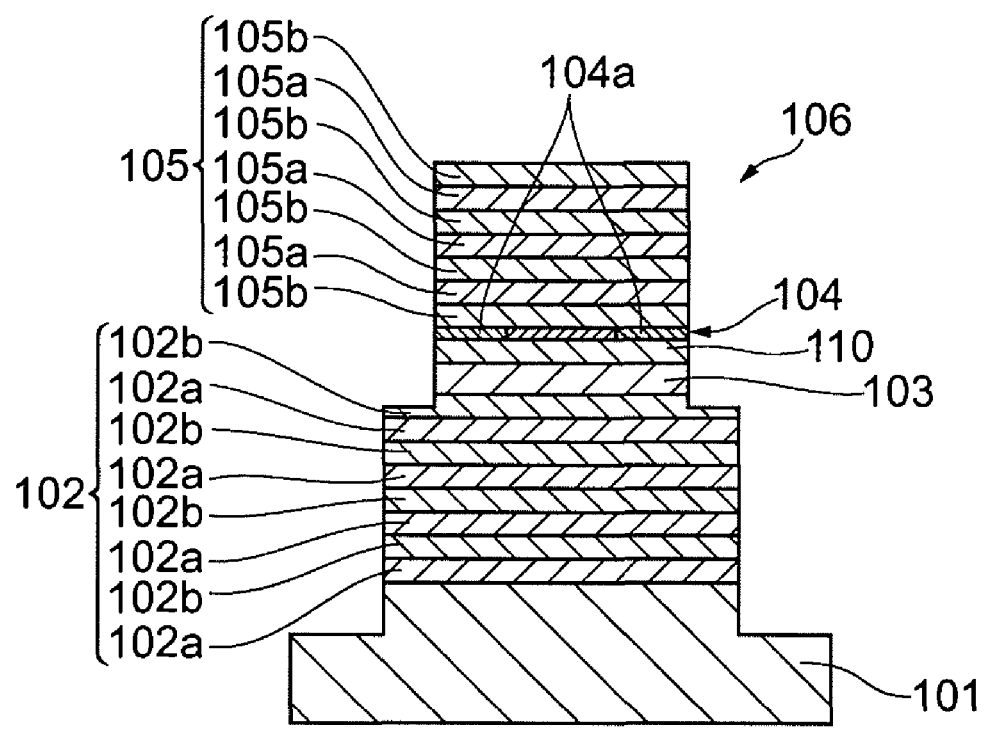
FIG. 16 is a cross-sectional side view showing an etching step of removing oxidized regions.

An advantage achieved by the method for producing the surface emitting laser 10 of this embodiment will be described. In the method of this embodiment, the oxidized regions 24c formed in the second DBR portion 24 are selectively etched by a selective wet etching method (first etching step). In this step, the oxidized regions 24c can be removed while suppressing etching of non-oxidized semiconductors. Subsequently, in the second etching step, the peripheral portion of the second DBR portion 24 is removed by, for example, dry etching process. The shape of the mesa portion 34 can be adjusted without excessively etching the non-oxidized semiconductors. Furthermore, the oxidized regions 24c of the second DBR portion 24 can be completely removed. In this case, the peripheral portion of the mesa portion 34 is substantially composed of a non-oxidized semiconductor (for example, AlGaAs). The etching rate of the non-oxidized semiconductor is higher than that of the oxidized layer for the dry etching process in the second etching step. Therefore, the etching process time can be reduced in comparison with etching process time in the etching step shown in FIG. 16. In the etching step shown in FIG. 16, the dry etching process is performed on the DBR portion including the non-oxidized regions and the oxidized regions. Accordingly, the etching depth of the first DBR portion 14 can be reduced.

Figure 17:
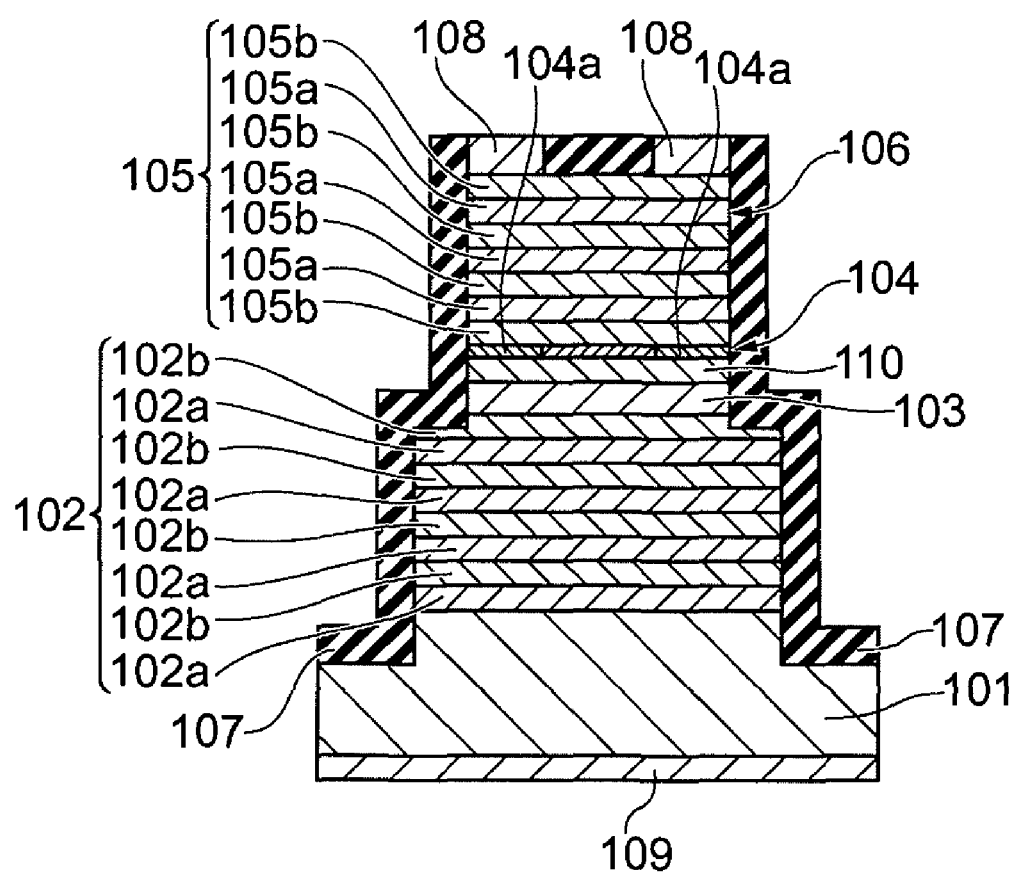
FIG. 17 is a cross-sectional side view showing a step of forming an insulating film and electrodes.

As described above, according to the method of this embodiment, the oxidized regions 24c of the second DBR portion 24 and non-oxidized semiconductors can be separately etched by the most suitable methods. Accordingly, in removing the oxidized regions 24c of the second DBR portion 24 by etching, it is possible to prevent from excessively etching of other non-oxidized semiconductors disposed around the mesa portion. Furthermore, in the second etching step, it is possible to prevent the etching from reaching the semiconductor substrate 12. As a result, a degradation of heat dissipation characteristics can be suppressed. In addition, since the oxidized regions 24c can be effectively removed, a decrease in reliability due to an internal stress can be suppressed. The surface emitting laser 10 in this embodiment has a low thermal resistance of about 3,000 K/W. Thus, good heat dissipation characteristics could be obtained as compared with a surface emitting laser shown in FIGS. 16 and 17 that has the higher thermal resistance of 3,500 K/W or more.

In this embodiment, the second DBR portion 24 includes the semiconductor layers 24a and the semiconductor layers 24b that have different refractive indices and are alternately stacked, and the aluminum contents of the semiconductor layers 24a and 24b are different from each other. In this case, the oxidized regions 24c of the semiconductor layers 24a having a high aluminum content extend toward the inner side of the second DBR portion 24, as compared with oxidized regions of the semiconductor layers 24b having a low aluminum content. According to the method for producing the surface emitting laser 10 of this embodiment, both the oxidized regions 24c of the semiconductor layers 24a and the oxidized regions of the semiconductor layers 24b can be effectively removed in the first etching step. In the first etching step, the projections and recesses are formed on the side face of the second DBR portion 24. The projections and recesses can be effectively eliminated in the second etching step.

Modification

Next, a modification of the method for producing a surface emitting semiconductor device according to the above embodiment will be described. In the method of this modification, steps up to the first etching step are the same as those of the above-described embodiment, and thus a description thereof is omitted.

Figure 10:
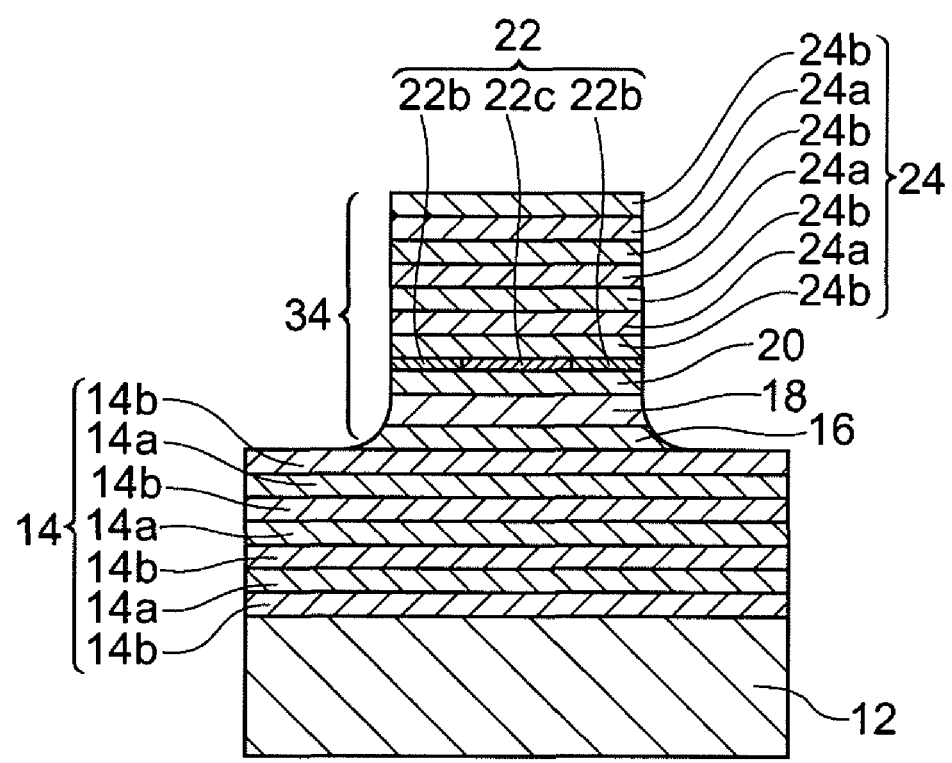
FIG. 10 is a cross-sectional side view showing a second etching step in a modification.
Figure 11:
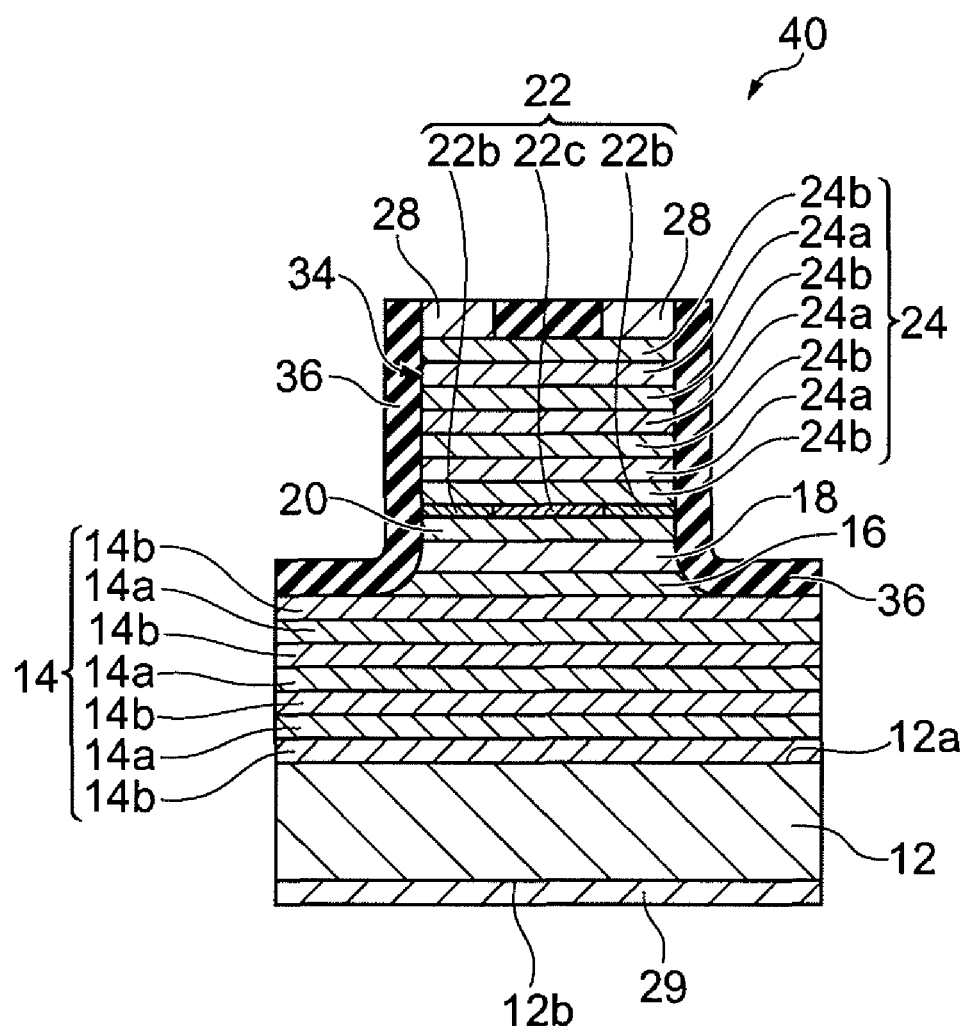
FIG. 11 is a cross-sectional side view showing a step of forming an insulating film and electrodes in the modification.
Figure 12:
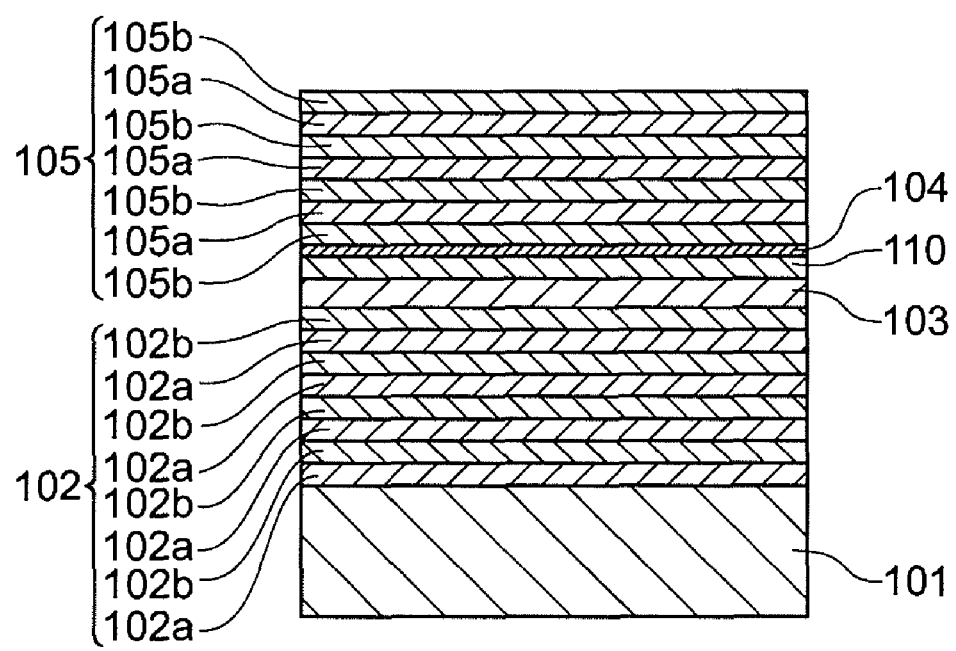
FIG. 12 is a cross-sectional side view showing a step (step of growing semiconductor layers on a semiconductor substrate) in a method for producing a conventional VCSEL.
Figure 13:
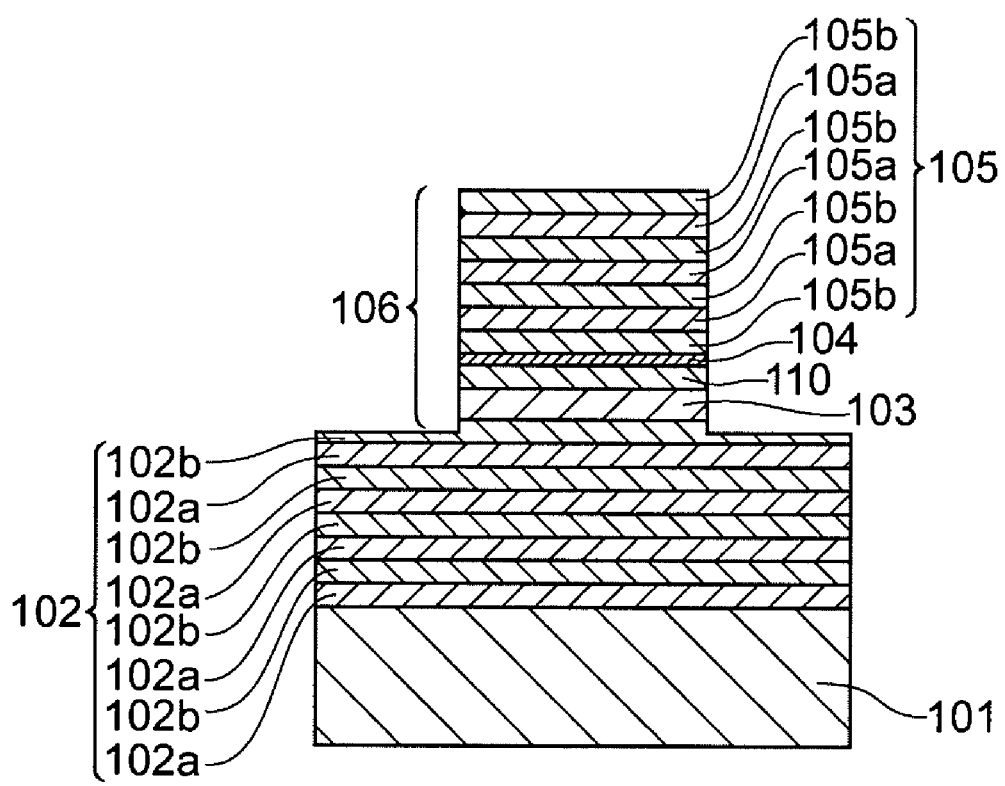
FIG. 13 is a cross-sectional side view showing a step (mesa formation step) in the method for producing a conventional VCSEL.

After the first etching step (refer to FIG. 6), the mesa portion 34 is further etched. As a result, the peripheral portion of the second DBR portion 24 is removed as shown in FIG. 10 (second etching step). First, the etching mask M2 (refer to FIG. 7) is formed on the mesa portion 34 as in the above embodiment. Next, a wet etching process is performed on the mesa portion 34 using the etching mask M2 to remove the peripheral portion of the mesa portion 34. In this step, the side face of the mesa portion 34 is planarized, and all the oxidized regions 24c (refer to FIG. 5) are completely removed. As shown in FIG. 11, an insulating film 36 is then formed on the top surface and the side face of the mesa portion 34. The insulating film 36 is composed of for example, SiN, SiO₂, or the like. Next, an opening of the insulating film 36 is formed on the top surface of the mesa portion 34, and an anode electrode 28 is formed in the opening. The anode electrode 28 is directly contact with the second DBR portion 24 of the mesa portion 34 through the opening of the insulating film 36. A cathode electrode 29 is formed on a back surface 12b of a semiconductor substrate 12. Through the above steps, the surface emitting laser 40 of this modification is produced.

In this modification, portions near the side faces of the semiconductor layers 24b of the second DBR portion 24, the semiconductor layers 24b having a low aluminum content, are etched in the second etching step using an etchant containing, for example, citric acid. In the portions near the side faces of the semiconductor layers 24b, three surfaces, namely, the top surface, the bottom surface, and the side face of each of the semiconductor layer 24b are exposed. Therefore, the etchant effectively contacts these portions, and the semiconductor material (AlGaAs) of the semiconductor layers 24b can be removed by etching. In addition, since the semiconductor layers 24b having a low aluminum content can be selectively etched, a semiconductor layer having a high aluminum content (such as a semiconductor layer 14a of the first DBR portion 14) functions as an etching stop layer. Accordingly, unlike the above embodiment in which a dry etching process is performed in the second etching step, the amount of etching of the first DBR portion 14 can be extremely reduced, and thus the heat dissipation characteristics can be further improved. The surface emitting laser 40 in this modification has a low thermal resistance of about 2,600 K/W. Thus, good heat dissipation characteristics could be obtained as compared with the surface emitting laser 10 in the above embodiment that has the thermal resistance of about 3,000 K/W.

According to the method of this modification, as in the above embodiment, since the oxidized regions 24c can be effectively removed, a decrease in reliability due to an internal stress can be suppressed.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a surface emitting semiconductor device, comprising:
   a step of forming a semiconductor stacked structure including an active layer, a first semiconductor layer containing aluminum and provided on the active layer, and a distributed Bragg reflector (DBR) portion provided on the first semiconductor layer, the DBR portion including second semiconductor layers and third semiconductor layers alternately stacked to each other, the second semiconductor layers and the third semiconductor layers having different aluminum contents;
   a step of forming a mesa portion by etching the DBR portion and the first semiconductor layer;
   an oxidation step of oxidizing the first semiconductor layer from a side face of the mesa portion toward the inside of the mesa portion, and forming an annular oxidized region inside the first semiconductor layer;

a first etching step of selectively etching an oxidized region formed in the DBR portion in the oxidation step by a wet etching; and a second etching step of removing a peripheral portion of the DBR portion by etching.

2. The method according to claim 1, wherein the aluminum content of the first semiconductor layer is higher than the aluminum contents of the second semiconductor layers and the third semiconductor layers of the DBR portion.

3. The method according to claim 1, wherein the first semiconductor layer is composed of an AlGaAs semiconductor or an AlAs semiconductor.

4. The method according to claim 1, wherein the first semiconductor layer is composed of an AlGaAs semiconductor and the aluminum content of the AlGaAs semiconductor is 90% or more.

5. The method according to claim 1, wherein, in the oxidation step, the first semiconductor layer is selectively oxidized in a water vapor atmosphere after the step of forming the mesa portion.

6. The method according to claim 1, wherein, in the first etching step, buffered hydrofluoric (BHF) acid is used as an etchant for selectively etching the oxidized region formed in the DBR portion.

7. The method according to claim 1, wherein, in the second etching step, the peripheral portion of the DBR portion is removed by dry etching.

8. The method according to claim 1, wherein, in the second etching step, the peripheral portion of the DBR portion is removed by wet etching, and semiconductor layers having a low aluminum content among the second semiconductor layers and the third semiconductor layers of the DBR portion are selectively etched.

9. The method according to claim 8, wherein, in the second etching step, an etchant containing citric acid is used as an etchant for the wet etching.

* * * * *